United States Patent [19]
DeShazo, Jr.

[11] Patent Number: 5,675,281
[45] Date of Patent: Oct. 7, 1997

[54] METHOD AND CIRCUIT FOR PREVENTING FORWARD BIAS OF A PARASITIC DIODE IN AN INTEGRATED CIRCUIT

[75] Inventor: Thomas R. DeShazo, Jr., Frenchtown, N.J.

[73] Assignee: Harris Corporation, Melbourne, Fla.

[21] Appl. No.: 652,933

[22] Filed: May 24, 1996

Related U.S. Application Data

[63] Continuation of Ser. No. 439,249, May 11, 1995, abandoned.

[51] Int. Cl.⁶ .................................................. G05F 1/10
[52] U.S. Cl. .................. 327/540; 327/312; 327/313; 327/382; 327/383; 327/545
[58] Field of Search .................................. 327/312, 313, 327/375, 382, 379, 383, 538, 540, 545, 560, 561, 563; 323/313, 315, 316; 330/257, 288

[56] References Cited

U.S. PATENT DOCUMENTS

| | | | |
|---|---|---|---|
| 4,380,740 | 4/1983 | Kaplan | 330/288 |
| 4,733,196 | 3/1988 | Menniti et al. | 330/288 |
| 5,028,881 | 7/1991 | Spence | 330/253 |
| 5,119,015 | 6/1992 | Watanabe | 323/313 |
| 5,381,106 | 1/1995 | Limberg | 327/104 |
| 5,412,309 | 5/1995 | Ueunten | 323/316 |
| 5,424,665 | 6/1995 | Sueri et al. | 327/108 |
| 5,434,533 | 7/1995 | Furutani | 327/538 |

OTHER PUBLICATIONS

Acquanita, IBM Technical Disclosure Bulletin—"Short-Circuit Protection For Driver Transistor", Jan. 1984, pp. 4146–4147.

*Primary Examiner*—Terry Cunningham
*Attorney, Agent, or Firm*—Rogers & Killeen

[57] ABSTRACT

A method and circuit for preventing forward bias of a collector-substrate diode in an integrated circuit with a bipolar transistor where a load driven by the transistor may be offset from a reference voltage, such as circuit ground, by a varying voltage offset. The difference between the bipolar transistor collector voltage and the reference voltage is sensed, and the bipolar transistor base current is varied responsive to the sensed difference so that the base current is zero when the collector voltage is equal to the reference voltage, whereby the collector current will be less than β times the base current when the emitter voltage is less than the reference voltage and the diode will not become forward biased.

12 Claims, 3 Drawing Sheets

METHOD AND CIRCUIT FOR PREVENTING FORWARD BIAS OF A PARASITIC DIODE IN AN INTEGRATED CIRCUIT

This is a continuation of application Ser. No. 08/439,249 filed May 11, 1995, now abandoned.

BACKGROUND OF THE INVENTION

The present invention is directed to methods and circuits for operating an integrated circuit having a parasitic diode, and more particularly to a method and circuit for preventing the forward biasing of a parasitic collector-substrate diode in a bipolar transistor in an integrated circuit where a load driven by the transistor may be offset from a reference voltage by a varying voltage offset.

With reference now to FIG. 1, a bipolar transistor 10 in an integrated circuit 12 of the prior art may be constructed on a substrate 14 of a conductivity type opposite that of the collector of the transistor. An NPN transistor is shown, although the invention is also applicable to PNP transistors. A PN junction 16 between collector 18 of bipolar transistor 10 and substrate 14 forms a parasitic diode, hereinafter referred to as a collector-substrate diode. Transistor 10 is turned on when the base voltage exceeds the emitter voltage by about 0.7 volts and a control current is provided to the base to forward bias a base-emitter junction 20. The current flows through transistor 10 from collector terminal C to emitter terminal E in proportion to the control current.

When emitter terminal E is connected to a negative voltage ($V_E < 0v$) and the control current is provided to the base, transistor 10 can be saturated if the collector current $I_C$ is less than the forward gain of the transistor, $\beta$, times the base current $I_B$, than is: $I_C < \beta I_B$. In this event, collector voltage $V_C$ of transistor 10 will fall to the emitter voltage plus the saturation voltage that is typically 0.2 volts.

$$V_C = V_E + V_{CE-SAT} \qquad (1)$$

This can cause the collector-substrate diode to become forward biased, resulting in current flow from substrate 14 into collector terminal C and out of emitter terminal E.

In some applications, forward biasing of the collector-substrate diode is undesirable. For example, a circuit may require that a current sourced to a load from transistor 10 be limited to the current supplied to collector terminal C by other components, with no contribution of current from the collector-substrate diode, even when $V_E$ is negative.

By way of further example, the actual ground potential of an automobile may vary by as much as two volts at various places in the automobile because of the large currents which flow in the ground return to battery. If integrated circuits are used in the automobile to drive remote loads which are returned to ground potential, the driving terminal of the integrated circuit could be sourcing current into a voltage source that is as much as two volts below its own ground. A bipolar transistor, such as transistor 10, connected as an emitter follower in the integrated circuit can be used to provide a source of current for the loads.

The automobile example may be more clearly understood with reference to FIG. 2 which depicts a circuit that includes NPN bipolar transistor Q11 on a P type substrate that provides a source current for driving a load resistance RL that is returned to ground through a voltage offset, $V_{OFFSET}$, which may vary and be negative with respect to circuit ground. That is, $V_E$ of transistor Q11 could be a negative voltage. The integrated circuit that includes transistor Q11 also includes a collector-substrate diode D1 which has its substrate biased to ground (for example, as illustrated in FIG. 1). In the circuit of FIG. 2, $V_S$, increases from $V_{BE}$ at a rate of dv/dt to $V_S + V_{BE}$ and subsequently decreases to $V_{BE}$ at a rate of –dv/dt. Desirably the circuit amplifies the signal and supplies it to load RL with increased amplitude and controlled slopes without regard for $V_{OFFSET}$. However, as discussed below, $V_{OFFSET}$ may effect the signal in the circuit of FIG. 2.

To simplify the explanation of operation of the circuit in FIG. 2, assume than $V_{BE}$ of all of the transistors is equal and constant, and that the base current is negligible. The current level in transistors Q1 and Q2 is $V_S/RS$. The emitter area of transistor Q3 is L times that of transistor Q2, and therefore the current level in transistor Q3 is $L(V_S/RS)$. The current level in transistors Q4 and Q5 is $V_S/RB$, and the current level in transistor Q6 is $M(V_S/RB)$. The current level in transistors Q8 and Q9 is $V_S/RC$, and the current level in transistor Q10 is $N(V_S/RC)$.

When $V_{OFFSET}$ is zero volts load resistor RL is returned to ground potential, and the voltage across resistor RO is:

$$V_{RO} = L(V_S)(RO/RS) \qquad (2)$$

The voltage at the base of transistor Q11 is $V_{RO} + V_{BE}$ and the voltage across RL is $V_E = V_{RO}$. The current from the collector of transistor Q6 flows partly to the base of transistor Q11 and partly to the emitter of transistor Q7. The emitter current $I_E$ of transistor Q11 is $V_E/RL$. If $I_E$ is less than $N(V_S)/RC$, then transistor Q10 becomes saturated and the voltage $V_C$ at the collector of transistor Q11 rises to Battery minus the saturation voltage $V_{CE-SAT}$. The collector-substrate diode D1 is therefore reverse biased. If $I_E$ is greater than $N(V_S)/RC$, then transistor Q11 becomes saturated and $V_C$ equals $V_E + V_{CE-SAT}$. Diode D1 remains reverse biased unless $V_E$ is a negative voltage which exceeds the forward voltage drop of diode D1, $V_D$, plus the saturation voltage of transistor Q11.

When the offset voltage is more negative than $V_D$ plus the saturation voltage of transistor Q11, the base-emitter junction of transistor Q7 is reverse biased, and all of the collector current from transistor Q6 flows into the base of transistor Q11. If the base current of transistor Q11 times $\beta$ now exceeds $N(V_S)/RC$, transistor Q11 becomes saturated and diode D1 will become forward biased and conduct. Under these conditions, the current supplied to RL is not limited to the current $N(V_S)/RC$ and the slope of the voltage change dv/dt will not be limited by the current $N(V_S)/RC$. Thus, in contrast to the desired result, the slopes dv/dt of the amplified signal are affected by $V_{OFFSET}$.

Accordingly, it is an object of the present invention to provide a novel method and circuit for preventing a parasitic diode from being forward biased than obviates the problems of the prior art.

It is another object of the present invention to provide a novel method and circuit for preventing forward bias of a collector-substrate diode in an integrated circuit with a bipolar transistor in which the base current of the transistor is varied responsive to a difference between transistor collector voltage and a reference voltage, such as ground potential.

It is yet another object of the present invention to provide a novel method and circuit for preventing forward bias of a collector-substrate diode in which the base current of the transistor is reduced to zero when there is zero difference between the transistor collector voltage and a reference voltage, and in which the difference is sensed with a pair of transistors having common bases and collectors with an emitter of one of the pair being connected to the reference voltage and the emitter of the other sensing the collector voltage.

It is still another object of the present invention to provide a novel method and circuit for preventing forward bias of a collector-substrate diode in which the difference between the transistor collector voltage and a reference voltage is sensed with a pair of transistors with an emitter of one of the pair being connected to the reference voltage and the emitter of the other sensing the collector voltage, and in which the collector current of the transistor with the collector voltage sensing emitter increases with decreasing collector voltage and in which the increasing collector current decreases the bipolar transistor base current.

It is a further object of the present invention to provide a novel method and circuit for reducing a base current of a bipolar transistor to zero as the bipolar transistor collector voltage approaches a ground potential so that a collector-substrate diode in an integrated circuit with the bipolar transistor does not become forward biased.

It is yet a further object of the present invention to provide a novel method and circuit for reducing a base current of a bipolar transistor to zero as the bipolar transistor collector voltage approaches a reference voltage in which a first transistor provides a base current to the bipolar transistor, in which a second transistor current increases as the bipolar transistor collector voltage decreases, and in which the increase of the second transistor current decreases the base current provided by the first transistor.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
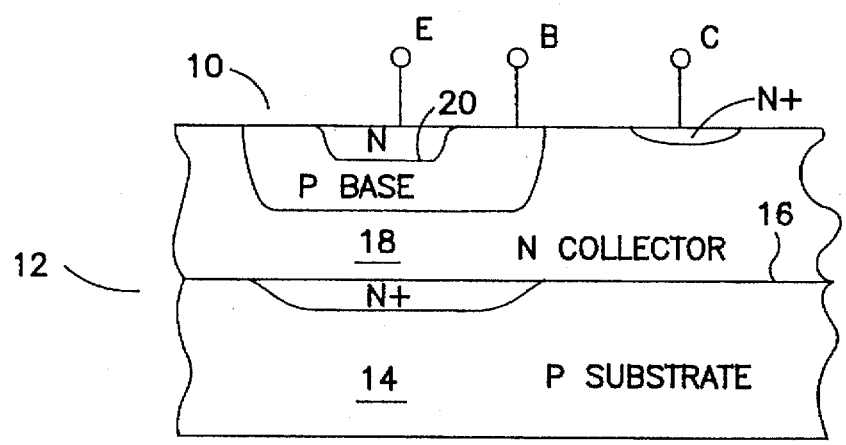
FIG. 1 is a vertical cross section of a portion of an NPN bipolar transistor on a P type substrate of the prior art.
Figure 2:
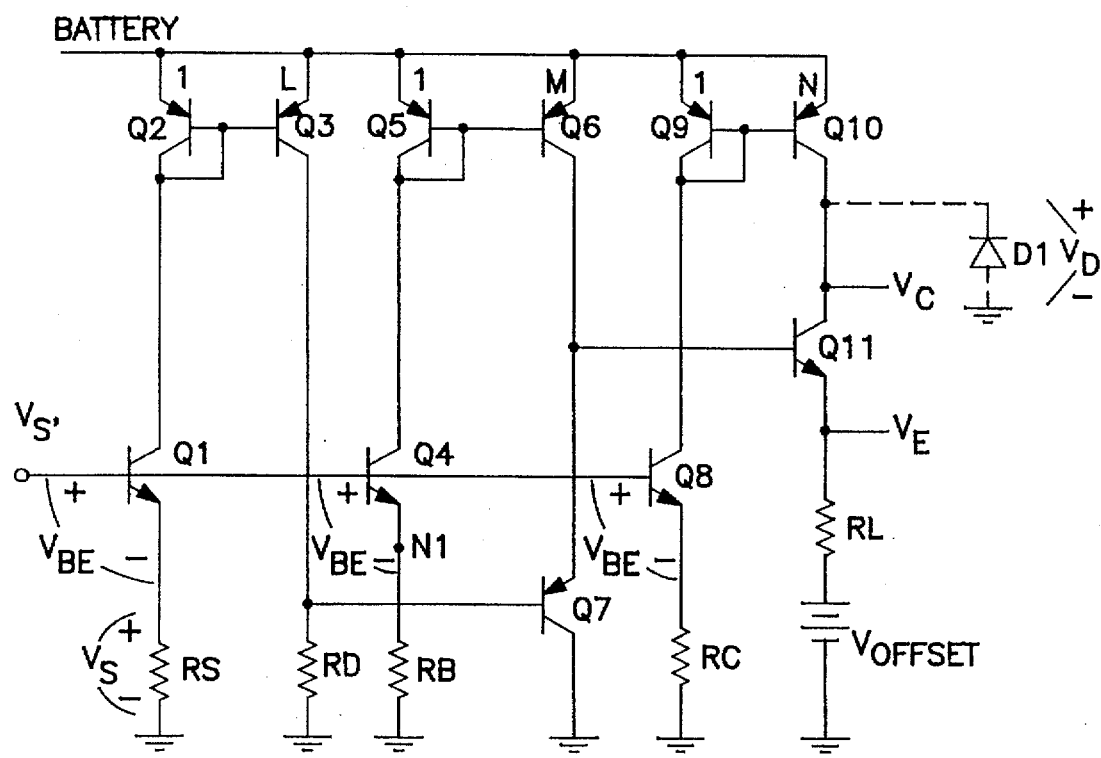
FIG. 2 is a diagram of a circuit for driving a load with which the present invention may find application.

In an embodiment of the present invention, and with further reference to the example of FIG. 2, the current level in transistor Q11 is limited to that current which is available from the collector of transistor Q10, to thereby prevent a forward bias of diode D1. The base current $I_B$ of transistor Q11 is reduced in response to the difference between transistor Q11 collector voltage $V_C$ and ground. When $V_C$ is at ground potential, $I_B$ is zero so that Q11 collector current $I_C$ will be less than $\beta$ times $I_B$, preventing transistor Q11 from becoming saturated and diode D1 from being forward biased.

Figure 3:
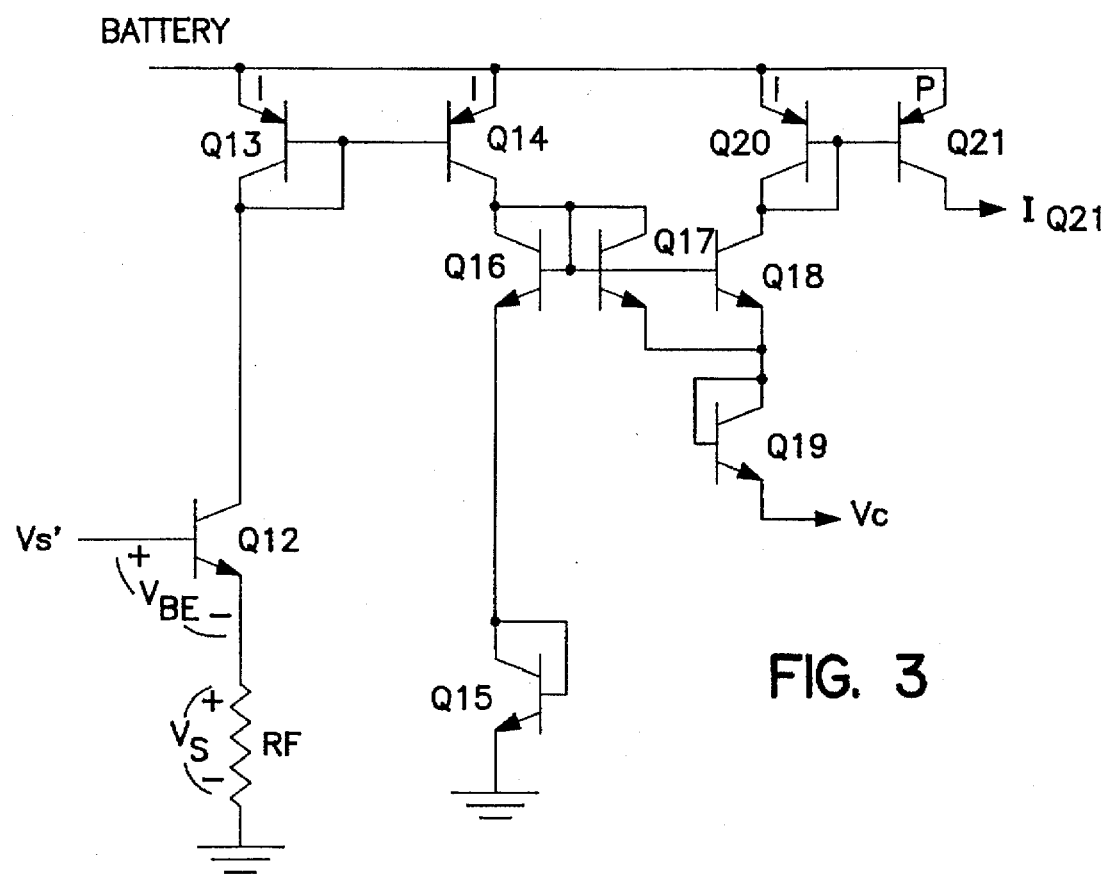
FIG. 3 is a circuit diagram of an embodiment of the present invention.

With reference now to FIG. 3, an embodiment of the present invention which may be used with the exemplary circuit of FIG. 2 may include transistors Q12, Q13, and Q14 in which the current level is $V_S/RF$. If the bipolar transistor collector voltage $V_C$ is higher than ground potential, current from the collector of transistor Q14 flows through transistors Q16 and Q15 to ground.

As the bipolar transistor collector voltage $V_C$ decreases and the difference between $V_C$ and ground decreases, current from the collector of transistor Q14 is shared between Q16 and Q17, and Q18 conducts at the same current level at Q17. Current from the emitters of transistors Q17 and Q18 flows to ground via Q19, Q11, RL and $V_{OFFSET}$. This current is desirably small relative to the collector current of transistor Q10. As the difference between $V_C$ and ground potential is further reduced, current levels in transistors Q17 and Q18 increase, causing the current levels in transistors Q20 and Q21 to increase. The collector current of transistor Q21 may be a multiple P times that of transistor Q20.

The current $I_{Q21}$ through transistor Q21 increases as difference between $V_C$ and ground decreases and may be used to decrease a base current to the bipolar transistor so that the base current is zero when $V_C$ is at ground potential. In the example of FIG. 2, $I_{Q21}$ may be provided to node N1 to reduce the current levels needed from transistors Q4 and Q5, thereby reducing the current at transistor Q6, and thereby reducing transistor Q11 base current. That is, $$I_4 = I_5 = (V_S/RB) - I_{Q21} \qquad (3)$$

Thus, the maximum current available to drive the base of transistor Q11 is:

$$I_B = M[(V_S/RB) - I_{Q21}] \qquad (4)$$

This current level will maintain $V_C$ at a level which is sufficiently positive to prevent forward biasing a parasitic diode, such as D1. The current provided to the load is thus limited to the current provided from the collector of transistor Q10.

Values of RB, RF, M, and P may be chosen so that when the difference between $V_C$ and ground is zero, $I_B$ is also zero (that is, $V_S/RB = I_{Q21}$).

Figure 4:
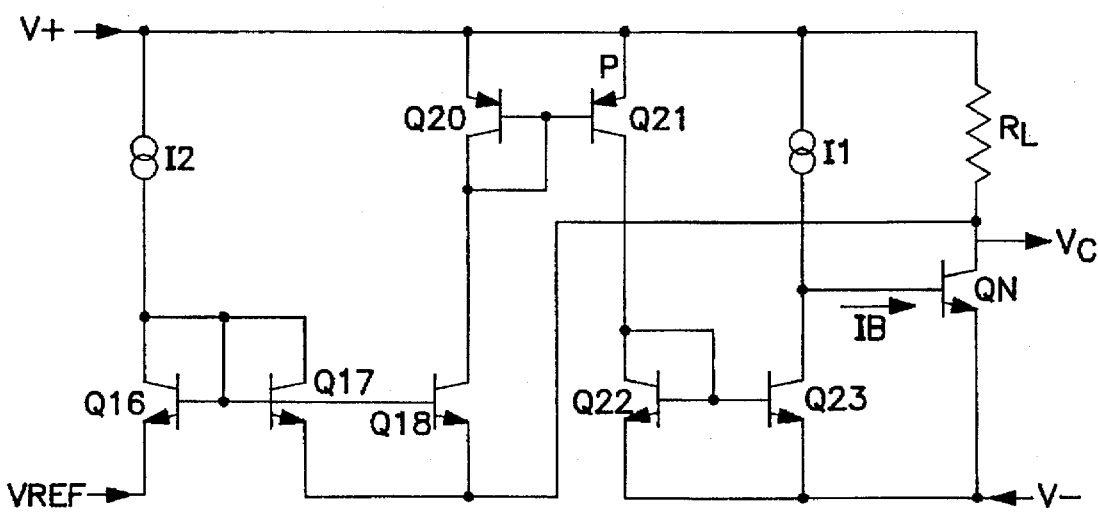
FIG. 4 is a circuit diagram of a further embodiment of the present invention for controlling base current to an NPN bipolar transistor.

With reference now to FIG. 4, a further embodiment of the present invention can be used to limit NPN bipolar transistor QN collector voltage $V_C$ to any predetermined level, $V_{REF}$, by reducing bipolar transistor QN base current $I_B$ as $V_C$ approaches $V_{REF}$. The normal source of $I_B$ may be current source I1.

When $V_C$ is more positive than $V_{REF}$, current from current source I2 flows via transistor Q16 to ground. The other transistors, Q17, Q18, Q20, Q21, Q22, and Q23, do not conduct, and all of the current from current source I1 is available as $I_B$ (transistor numbers from FIG. 3 have been used on similar transistors in FIGS. 4 and 5 to facilitate an understanding thereof.)

As $V_C$ approaches $V_{REF}$, the current from I2 is shared between transistors Q16 and Q17. In the manner discussed above, the current levels in transistors Q18, Q20 and Q21 increase as the current in Q17 increases. The current level in transistor Q21 may be P times the current level of transistor Q20, and equal to the current levels in transistors Q22 and Q23. If the following equation is true:

$$[V^+ - \beta(I_B)(RL)] < V_C \qquad (5)$$

then IB should be reduced to prevent the collector-substrate diode from being forward biased. Since $$I_B = I1 - P(I_{Q18}) \qquad (6)$$

and since $I_{Q18}$ increases as $V_C$ decreases, $I_B$ will decrease to limit base current available to transistor QN, thereby limiting the collector voltage of transistor QN to $V_C$.

Figure 5:
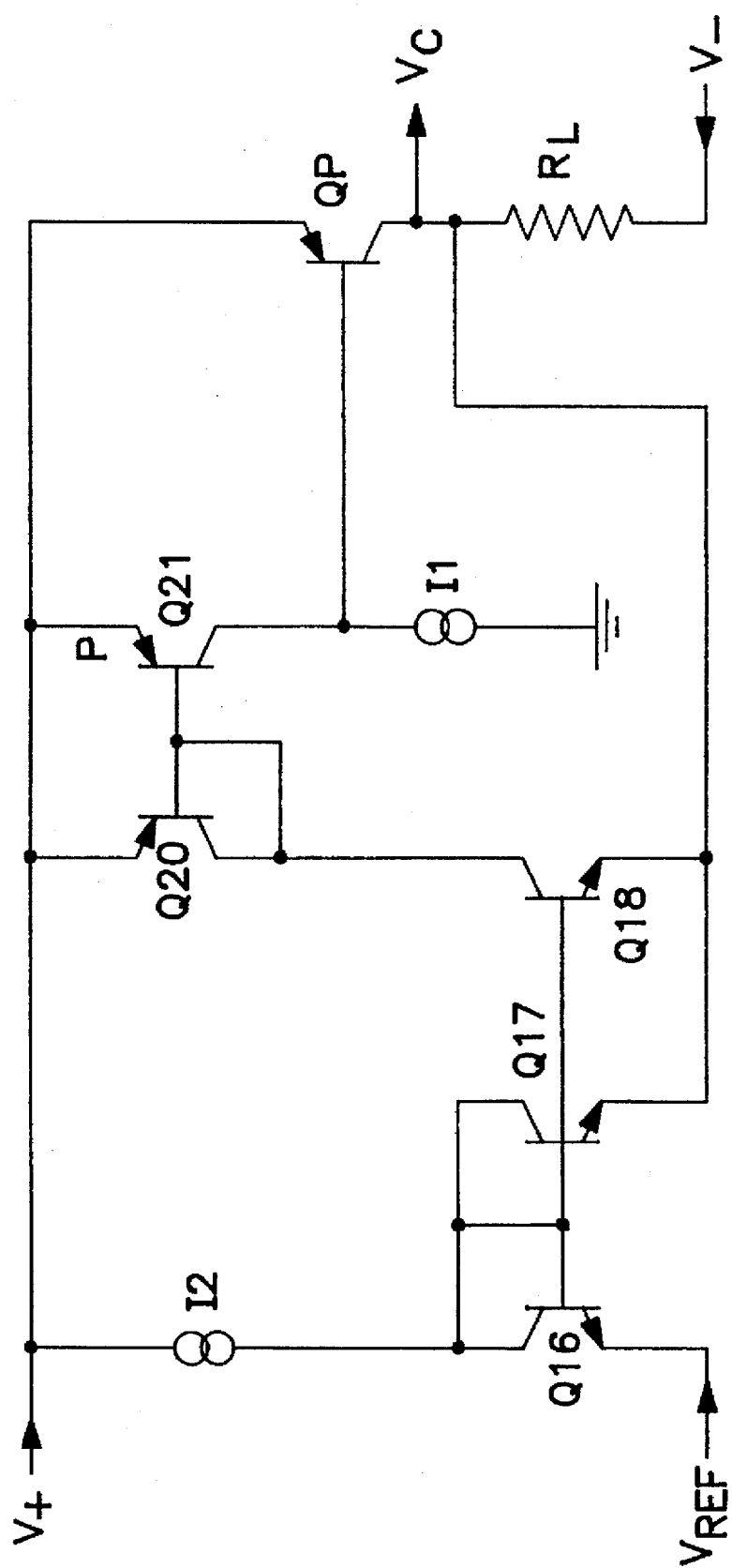
FIG. 5 is a circuit diagram of a further embodiment of the present invention for controlling base current to a PNP bipolar transistor.

A further embodiment of the present invention that may be used to control the base current that is available to a PNP bipolar transistor QP is illustrated in FIG. 5. As will be appreciated by those of skill in the art, operation of the circuit is similar to that discussed above.

The present invention is not limited to the circuits herein which are illustrative only, and which may be modified for use with sourcing circuits other than shown in FIG. 2 that include a parasitic diode that is desirably not forward biased. The scope of the invention is to be defined solely by the appended claims when accorded a full range of equivalence, many variations and modifications naturally occurring to those of skill in the art from a perusal hereof.

What is claimed is:

1. A method of preventing forward bias of a collector-substrate diode in an integrated circuit with a bipolar transistor having forward gain β and in which the substrate is biased to ground, the method comprising the steps of:

(a) providing collector and base currents and an emitter voltage which can be less than ground to the bipolar transistor in the integrated circuit, wherein the diode will become forward biased when (i) the base current times β exceeds the collector current, and (ii) the emitter voltage of the bipolar transistor is less than ground;

(b) sensing a difference between the bipolar transistor collector voltage and ground; and (c) varying the bipolar transistor base current responsive to the sensed difference so that the base current is zero when the collector voltage is equal to ground and so the collector current will not be less than β times the base current when the emitter voltage is less than ground, whereby the diode will not become forward biased, said base current being varied by the steps of:

providing the bipolar transistor base current from a current source; and decreasing the current from the current source that is available to the base of the bipolar transistor as a collector current of a first transistor increases responsive to a decrease in the collector voltage of the bipolar transistor, the step of sensing a difference comprising the steps of:

providing second and third transistors having a common base and a common collector, the second transistor having an emitter connected to ground, and the third transistor having an emitter connected to the bipolar transistor collector voltage;

increasing the collector current of the third transistor relative to the collector current of the second transistor as the bipolar transistor collector voltage decreases to ground; and increasing the collector current of the first transistor as the collector current of the third transistor increases.

2. The method of claim 1 wherein the step of sensing a difference further comprises the steps of:

providing a fourth transistor having a common base and a common emitter with the first transistor;

providing a fifth transistor having a common base and a common emitter with the third transistor;

connecting the collectors of the fourth and fifth transistors, so that an increase in current at the collector of the third transistor causes an increase in currents at the collectors of the fourth and fifth transistors, which causes an increase in the collector current at the first transistor.

3. A method of reducing a base current of a bipolar transistor to zero as the bipolar transistor collector voltage approaches ground so that a collector-substrate diode in an integrated circuit with the bipolar transistor does not become forward biased, the diode substrate begin biased to ground, the method comprising the steps of:

(a) providing the bipolar transistor base current from a current source;

(b) decreasing the current from the current source that is available to the bipolar base as a collector current of a first transistor increases responsive to a decrease in the collector voltage of bipolar transistor;

(c) providing second and third transistors having a common base and a common collector, the second transistor having an emitter connected to ground, and the third transistor having an emitter connected to the bipolar transistor collector voltage;

(d) increasing the collector current of the third transistor relative to the collector current of the second transistor as the bipolar transistor collector voltage decreases to ground; and (e) increasing the collector current of the first transistor as the collector current of the third transistor increases, whereby the base current of the bipolar transistor is zero when the bipolar transistor collector voltage is at ground.

4. The method of claim 3 further comprising the steps of:

(f) providing a fourth transistor having a common base and a common emitter with the first transistor;

(g) providing a fifth transistor having a common base and a common emitter with the third transistor;

(j) connecting the collectors of the fourth and fifth transistors, so that an increase in current at the collector of the third transistor causes an increase in currents at the collectors of the fourth and fifth transistors, which causes an increase in the collector current at the first transistor.

5. A circuit for preventing forward bias of a collector-substrate diode comprising in an integrated circuit;

a bipolar transistor having forward gain β and a substrate biased to ground, said bipolar transistor having a collector-substrate diode therein which will become forward biased when said bipolar transistor base current times β exceeds said bipolar transistor collector current and when said bipolar transistor emitter voltage is less than ground;

means for sensing a difference between said bipolar transistor collector voltage and ground; and means for varying said bipolar transistor base current responsive to the sensed difference so that the base current is zero when the collector voltage is equal to ground and so that the collector current will not be less than β times the base current when the emitter voltage is less than ground, whereby said diode will not become forward biased, said means for varying comprising means for providing the base current for the bipolar transistor, and a first transistor with a collector current that increases responsive to a decrease in the collector voltage of the bipolar transistor, whereby the current that is available to the base of the bipolar transistor decreases as the collector current of said first transistor increases, said means for sensing comprising, second and third transistors having a common base and a common collector, said second transistor having an emitter connected to ground, and said third transistor having an emitter connected to the bipolar transistor collector, and whereby the collector current of said third transistor increases relative to the collector current of said second transistor as the bipolar transistor collector voltage decreases to ground, and wherein said means for varying further comprises means for increasing the collector current of said first transistor as the collector current of said third transistor increases.

6. The circuit of claim 5 wherein said means for varying further comprises a fourth transistor having a common base and a common emitter with said first transistor, and wherein said means for sensing further comprises a fifth transistor having a common base and a common emitter with said third transistor, the collectors of said fourth and fifth transistors being connected so that an increase in current at the collector of said third transistor causes an increase in currents at the collectors of said fourth and fifth transistors, which causes an increase in the collector current at said first transistor.

7. A circuit for reducing a base current of a bipolar transistor collector to zero as the bipolar transistor collector voltage approaches ground so that a collector-substrate diode in an integrated circuit with the bipolar transistor does not become forward biased, the diode substrate being biased to ground, the circuit comprising:

a current source for providing the bipolar transistor base current;

a first transistor having a collector connected for changing the bipolar transistor base current and a base connected so that said first transistor collector current increases responsive to a decrease in the collector voltage of the bipolar transistor;

second and third transistors having a common base and a common collector, said second transistor having an emitter connected to ground, and said third transistor having an emitter connected to the bipolar transistor collector;

whereby the collector current of said third transistor increases relative to the collector current of said second transistor as the bipolar transistor collector voltage decreases to ground; and means operably connected to the base and emitter of the first transistor for increasing the collector current of said first transistor as the collector current of said third transistor increases, whereby the base current of the bipolar transistor reduces to zero as the bipolar transistor collector voltage approaches ground.

8. The circuit of claim 7 further comprising, a fourth transistor having a common base and a common emitter with said first transistor, a fifth transistor having a common base and a common emitter with said third transistor;

said fourth and fifth transistors having connected collectors so that an increase in current at the collector of said third transistor causes an increase in currents at the collectors of said fourth and fifth transistors, which causes an increase in the collector current at said first transistor.

9. The circuit of claim 7 wherein said current source comprises a fourth transistor.

10. A circuit for preventing forward bias of a collector-substrate diode in an integrated circuit with a bipolar transistor having forward gain $\beta$ and in which the substrate is biased to ground, wherein the diode will become forward biased when the bipolar transistor base current times $\beta$ exceeds the bipolar transistor collector current and when the bipolar transistor emitter voltage is less than ground, the circuit comprising;

means for sensing a difference between the bipolar transistor collector voltage and ground, said means for sensing comprising, a pair of transistors having a common base and a common collector, a first one of said pair of transistors having an emitter connected to ground, and the other one of said pair of transistors having an emitter connected to the bipolar transistor collector, and whereby the collector current of said other one of said pair of transistors increases relative to the collector current of said one of said pair of transistors as the bipolar transistor collector voltage decreases to ground; and means for varying the bipolar transistor base current responsive to the sensed difference whereby the base current is zero when the collector voltage is equal to ground and so that the collector current will not be less than $\beta$ times the base current when the emitter voltage is less than ground, whereby the diode will not become forward biased.

11. The circuit of claim 10 wherein said means for varying comprises means for providing the base current for the bipolar transistor, and a further transistor with a collector current that increases responsive to a decrease in the collector voltage of the bipolar transistor, whereby the current that is available to the base of the bipolar transistor decreases as the collector current of said first transistor increases.

12. The circuit of claim 11 wherein said means for varying further comprises means for increasing the collector current of said further transistor as the collector current of said other one of said pair of transistors increases.

* * * * *